United States Patent [19]
Hinedi et al.

[11] Patent Number: 6,141,200
[45] Date of Patent: Oct. 31, 2000

[54] STACKED PFET OFF-CHIP DRIVER WITH A LATCH BIAS GENERATOR FOR OVERVOLTAGE PROTECTION

[75] Inventors: Fahd Hinedi, Austin; Lakshmikant Mamileti, Cedar Park, both of Tex.

[73] Assignees: International Business Machines Corporation, Armonk, N.Y.; Motorola, Inc., Schaumburg, Ill.

[21] Appl. No.: 09/062,678

[22] Filed: Apr. 20, 1998

[51] Int. Cl.[7] ........................................ H02H 3/22
[52] U.S. Cl. ............................. 361/111; 361/90
[58] Field of Search ................ 361/56, 91, 111, 361/90, 92, 86, 18; 327/108, 112; 326/86

[56] References Cited

U.S. PATENT DOCUMENTS

| | | | |
|---|---|---|---|
| 4,689,504 | 8/1987 | Raghunathan et al. | 307/449 |
| 4,820,936 | 4/1989 | Veendrick et al. | 307/296.2 |
| 4,975,598 | 12/1990 | Borkar | 307/443 |
| 5,387,826 | 2/1995 | Shay et al. | 361/21 |
| 5,532,621 | 7/1996 | Kobayashi et al. | 326/86 |
| 5,555,149 | 9/1996 | Wert et al. | 361/18 |
| 5,576,635 | 11/1996 | Partovi et al. | 326/27 |
| 5,629,634 | 5/1997 | Carl et al. | 326/27 |
| 5,646,809 | 7/1997 | Motley et al. | 361/56 |
| 5,754,380 | 5/1998 | Ker et al. | 361/56 |
| 5,804,998 | 9/1998 | Cahill et al. | 327/108 |
| 5,815,354 | 9/1998 | Braceras et al. | 361/56 |

*Primary Examiner*—Michael J. Sherry
*Attorney, Agent, or Firm*—Anthony V. S. England; Felsman, Bradley, Vaden, Gunter & Dillon, LLP

[57] ABSTRACT

Series-connected stacked PFETS are employed in an off-chip driver output stage. When the output driver is enabled, the gate of the PFET transistor directly connected to the output is biased by a latch at a voltage level of either one threshold voltage above ground or one threshold voltage below the power supply, depending on the data signal. This provides overvoltage protection even for overshoots and undershoots of one threshold voltage or less, and provides overvoltage protection below the threshold voltages required to activate conventional overvoltage protection devices. Tight tolerances for maximum gate voltages may thus be achieved, and smaller devices having thinner gate oxides utilized in the off-chip drivers of a processor or other device.

18 Claims, 2 Drawing Sheets

6,141,200

STACKED PFET OFF-CHIP DRIVER WITH A LATCH BIAS GENERATOR FOR OVERVOLTAGE PROTECTION

BACKGROUND OF THE INVENTION

1. Technical Field

The present invention relates in general to bus driver circuits in data processing systems and in particular to bus driver circuits providing overvoltage protection. Still more particularly, the present invention relates to utilization of stacked PFETs at the output of a bus driver to provide a margin of overvoltage protection under the threshold voltage of an overvoltage device.

2. Description of the Related Art

Contemporary processors typically contain a large number of devices at a high density, forcing the device dimensions to the smallest possible levels. As processor technology advances, device geometries shrink, including gate oxide thicknesses. Reduction of gate oxide thickness, however, is generally attended by a corresponding reduction in the maximum allowable voltage between the device gate and source ($V_{gs}$). Excess voltages may damage the gate oxide, precluding the device from proper operation and potentially rendering the processor worthless.

In most data processing system architectures, processors are required to directly interface with a bus connected to various input/output devices such as caches and/or system memories, graphics adapters, bus bridges, etc. Thus processors typically include off-chip drivers for driving the bus conductors of a bus connecting the processor to various other devices. However, processor technology is advancing at a much faster pace than input/output interface voltages. The 5 V or 3.3 V signal voltage levels employed according to most bus specifications, for example, may exceed the maximum allowable voltages for devices within the off-chip driver portion of a processor.

Even where devices within an off-chip driver are designed to tolerate specified signal voltage levels, signal reflections on the bus conductors connected to an off-chip driver may cause high overshoots (voltages in excess of the power supply voltage) and undershoots (voltages below ground or the negative power supply voltage, also called "negative overshoots"). Additionally, off-chip drivers interface with a wide array of devices, such as ASICs and SRAMs, which may individually cause large overshoots or undershoots when driving the system bus. The magnitude of these overshoots and undershoots may easily violate the maximum allowable gate to source/drain voltages allowed by the processor technology. Violation of the maximum $V_{gs}$ specification may destroy the devices in the off-chip driver.

The potential for violating maximum allowable voltages and thereby damaging devices dictates the need for overvoltage protection circuitry within the off-chip driver. As device geometries shrink, even within the off-chip driver portion of the processor, overshoots and undershoots below the threshold voltage of conventional overvoltage protection circuits may potentially damage devices within the off-chip driver, or at least alter the performance of such devices.

It would be desirable, therefore, to provide overvoltage protection within an off-chip driver which protects even against overshoots and undershoots below the threshold voltage of conventional overvoltage protection circuits.

SUMMARY OF THE INVENTION

It is therefore one object of the present invention to provide an improved bus driver circuit for data processing systems.

It is another object of the present invention to provide an improved bus driver including overvoltage protection within data processing systems.

It is yet another object of the present invention to provide and method and apparatus for utilization of stacked PFETs at the output of a bus driver to provide a margin of overvoltage protection under the threshold voltage of an overvoltage device.

The foregoing objects are achieved as is now described. Series-connected stacked PFETS are employed in an off-chip driver output stage. When the output driver is enabled, the gate of the PFET transistor directly connected to the output is biased by a latch at a voltage level of either one threshold voltage above ground or one threshold voltage below the power supply, depending on the data signal. This provides overvoltage protection even for overshoots and undershoots of one threshold voltage or less, and provides overvoltage protection below the threshold voltages required to activate conventional overvoltage protection devices. Tight tolerances for maximum gate voltages may thus be achieved, and smaller devices having thinner gate oxides utilized in the off-chip drivers of a processor or other device.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
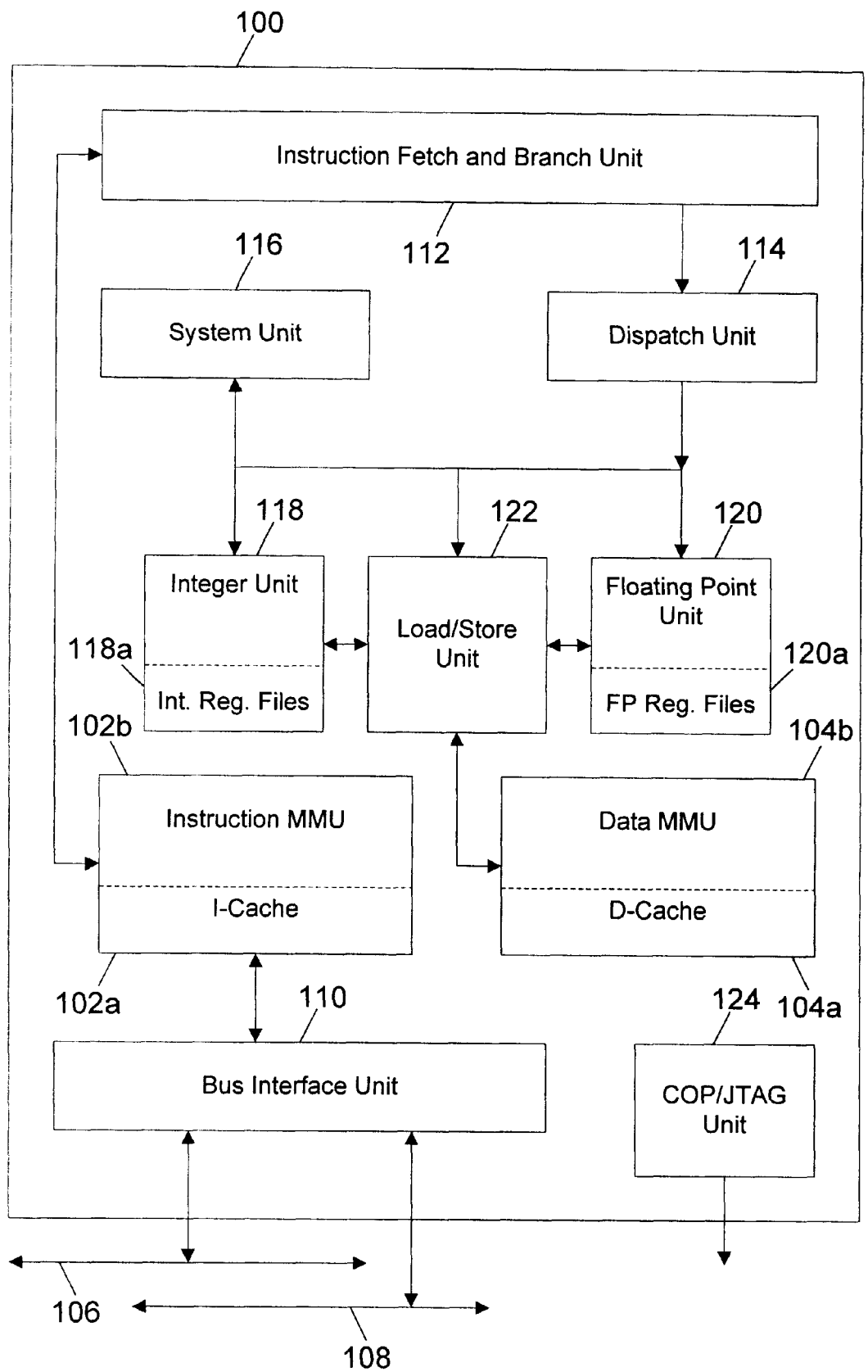
FIG. 1 depicts a block diagram of a processor and related portions of a data processing system in which a preferred embodiment of the present invention may be implemented.

With reference now to the figures, and in particular with reference to FIG. 1, a block diagram of a processor and related portions of a data processing system in which a preferred embodiment of the present invention may be implemented are depicted. Processor 100 is a single integrated circuit superscalar microprocessor, such as the PowerPC™ processor available from IBM Corporation of Armonk, N.Y. Accordingly, processor 100 includes various units, registers, buffers, memories, and other sections, all of which are formed by integrated circuitry. Processor 100 also operates according to reduced instruction set computing ("RISC") techniques.

Processor 100 includes level one (L1) instruction and data caches ("I-Cache" and "D-Cache") 102a and 104a, respectively, each having an associated memory management unit 102b and 104b. As shown in FIG. 1, processor 100 is connected to system address bus 106 and to system data bus 108 via bus interface unit 110. Bus interface unit 110 accordingly includes off-chip drivers in accordance with the present invention, as described in greater detail below.

Instructions retrieved from system memory (not shown) through bus interface unit 110 are stored in instruction cache 102a, while data retrieved through bus interface unit 110 is stored in data cache 104a. Instructions are fetched as needed from instruction cache 102a by instruction fetch and branch unit 112, which also performs instruction branch prediction, and issued to dispatch unit 114. Dispatch unit 114 dispatches instructions as appropriate to system unit 116, integer unit 118, floating point unit 120, or load/store unit 122.

System unit 116 executes condition register logical, special register transfer, and other system instructions. Integer or fixed-point unit 118 performs add, subtract, multiply, divide, shift or rotate operations on integers, and includes integer or general purpose registers 118a. Floating point unit 120 performs single precision and/or double precision multiply/add operations, and includes floating point registers 120a. Load/store unit 122 loads instructions operands from data cache 104a into integer or floating point registers 118a or 120a as needed, and stores instructions results when available from integer or floating point registers 118a or 120a into data caches 104a. Common on-chip processor ("COP") and joint test action group ("JTAG") unit 124 provides a serial interface to the system for performing boundary scan interconnect tests.

The architecture depicted in FIG. 1 is provided solely for the purpose of illustrating and explaining the present invention, and is not meant to imply any architectural limitations. Those skilled in the art will recognize that many variations are possible. Processor 100 may include, for example, reservation stations and a completion unit to permit out-of-order instruction processing, or may include multiple integer and floating point execution units to increase processing throughput. All such variations are within the spirit and scope of the present invention. Furthermore, although the preferred embodiment of the present invention is described within the context of off-chip drivers in bus interface unit 110 within processor 100, the present invention may be implemented and utilized in any device having off-chip drivers connecting the device to a bus. Thus, for example, the present invention may be employed within a memory (SDRAM, RDRAM, or the like), a bridge (such as a PCI bus bridge), or any other device where overvoltage protection is necessary to prevent gate oxide damage resulting from overshoots or undershoots less than the threshold voltage of conventional overvoltage protection devices.

Figure 2:
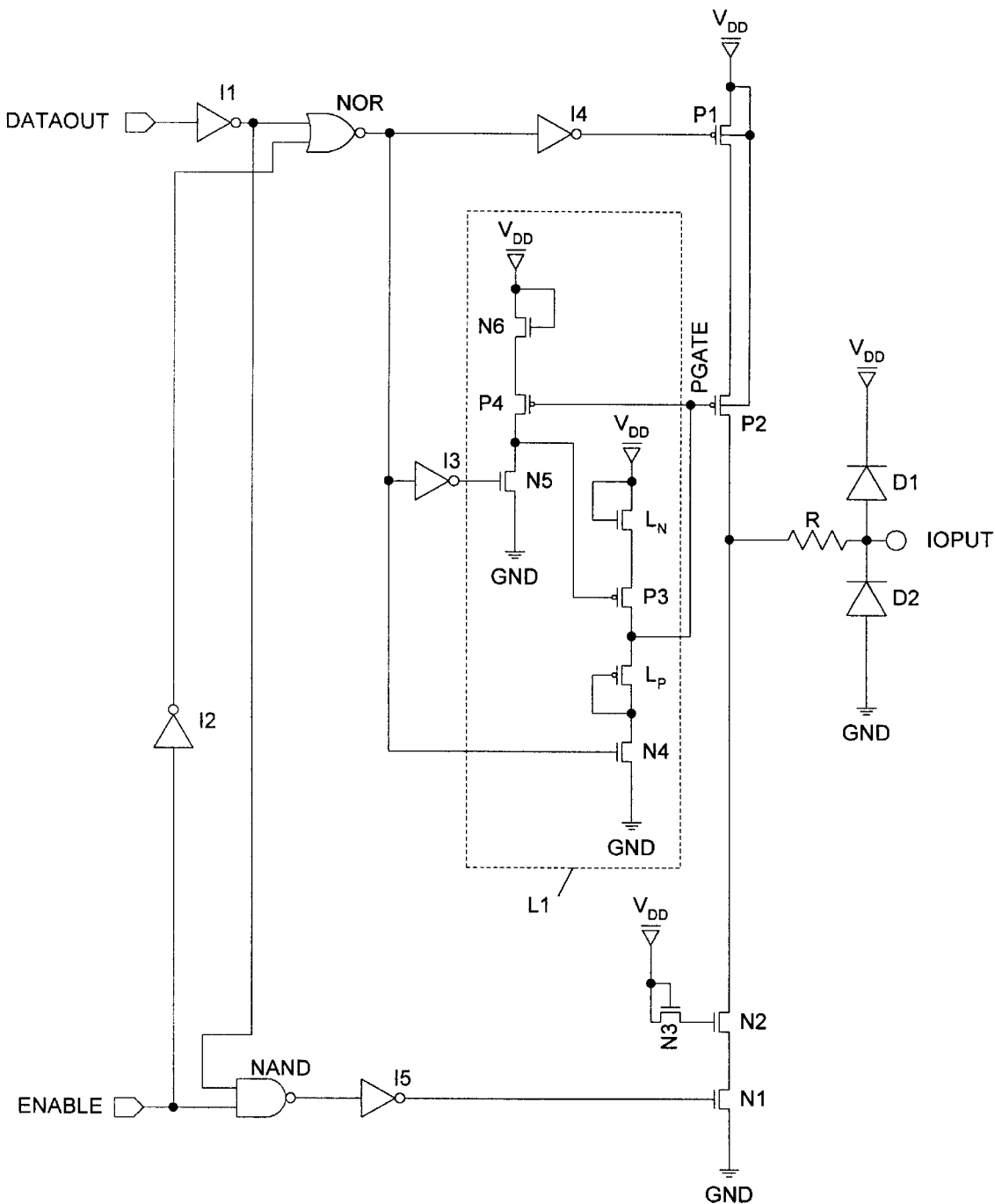
FIG. 2 is a circuit diagram of an off-chip driver output stage in accordance with a preferred embodiment of the present invention.

Referring now to FIG. 2, a circuit diagram of an off-chip driver output stage in accordance with a preferred embodiment of the present invention is illustrated. The off-chip driver output stage of the present invention utilizes a stacked PFET design employing two p-channel field effect transistors P1 and P2 connected in series between a power supply voltage $V_{DD}$ and an output node. Transistor P2 is most susceptible to overshoots and undershoots at the output, and is therefore biased at the gate to the source and drain with a voltage of either one threshold voltage ($V_T$) above ground or one threshold voltage below the power supply voltage $V_{DD}$. This bias voltage and stacked device P2 provide a margin of overshoot and undershoot protection up to the threshold voltage of other overvoltage protection devices, keeping device P1 from being exposed to voltages exceeding the maximum $V_{gs}$ voltage allowed by the technology employed to implement the output stage.

Input terminal DATAOUT of the illustrated off-chip driver output stage is connected to the input of inverter I1, with the output of inverter I1 connected to one input of logic gate NOR and to one input of logic gate NAND. The other input of logic gate NOR is connected to the output of inverter I2, which is connected at the input to input terminal ENABLE. Input terminal ENABLE is also connected to the other input of logic gate NAND.

The output of logic gate NOR is connected to the inputs of inverters I3 and I4. The output of inverter I3 is connected to a first input of latch L1, while the output of inverter I4 is connected to the gate of the p-channel field effect transistor P1. The output of logic gate NOR is also connected directly to a second input of latch L1. The output of latch L1 is connected to node PGATE at the gate of p-channel field effect transistor P2. Transistor P1 is connected at the source to the power supply voltage $V_{DD}$ and at the drain to the source of transistor P2. Transistor P2 is connected at the drain to an output node connected, through resistor R, to output terminal IOPUT.

Also connected to output terminal IOPUT are diodes D1 and D2. Diode D1 is connected at the input to output terminal IOPUT and resistor R, and at the output to power supply voltage $V_{DD}$. Diode D2 is connected at the input to ground voltage GND and at the output to output terminal IOPUT and resistor R. Diodes D1 and D2 provide overvoltage protection for overshoots and undershoots in excess of one threshold voltage drop ($V_T$).

The output of logic gate NAND is connected to the input of inverter I5. The output of inverter I5 is connected to the gate of n-channel field effect transistor N1, which is connected at the source to ground voltage GND and at the drain to the source of n-channel field effect transistor N2. The drain of transistor N1 is connected to the output node connected, through resistor R, to output terminal IOPUT. A diode-connected, n-channel field effect transistor N3 is connected between power-supply voltage $V_{DD}$ and the gate of transistor N2, with the gate and drain of transistor N3 being connected to power supply voltage $V_{Dd}$ and the source of transistor N3 being connected to the gate of transistor N2. Transistors N1, N2, and N3 provide a mechanism for tristating output terminal IOPUT when the output stage enable signal received at input terminal ENABLE is not asserted.

In the exemplary embodiment, latch L1 includes diode-connected, n-channel field effect transistor $L_N$ and diode connected, p-channel field effect transistor $L_P$ providing the threshold voltage drops for biasing node PGATE at the gate of transistor P2. Diode-connected transistor $L_N$ is connected at the drain and gate to power supply voltage $V_{DD}$ and at the source to the drain of p-channel field effect transistor P3. The source of transistor P3, serving as the output of latch L1, is connected to the gate of transistor P2 at node PGATE. Also connected to the source of transistor P3 and to node PGATE is the source of diode-connected transistor $L_P$, which is connected at the gate and drain to the drain of n-channel field effect transistor N4. Transistor N4 is connected at the source to ground voltage GND and at the gate, which serves at the second input to latch L1, to the output of logic gate NOR. Transistor N4 connects node PGATE to ground voltage GND through diode-connected transistor $L_P$, with a threshold voltage ($V_{TLP}$) drop occurring across transistor $L_P$.

The gate of transistor P3 is connected to the drain of p-channel field effect transistor P4 and to the drain of n-channel field effect transistor N5. Transistor N5 is connected at the source to ground voltage GND. The gate of transistor N5, which serves as the first input to latch L1, is connected to the output of inverter I5. Transistor N5 connects node PGATE to power supply voltage $V_{DD}$ through diode-connected transistor $L_N$, with a threshold voltage ($V_{TLN}$) drop occurring across transistor $L_N$.

The drains of transistors P4 and N5 are connected together. The source of transistor P4 is connected to power supply voltage $V_{DD}$ through diode-connected n-channel field effect transistor N6, which is connected at the drain and gate to power supply voltage $V_{DD}$ and at the source to the source of transistor P4. The gate of transistor P4 is connected to node PGATE, and thereby connected also to the gate of transistor P2 and the source of transistor P3.

In operation, the driver output stage depicted in FIG. 2 tristates the output node and, through connecting resistor R, output terminal IOPUT when the driver enable signal received at input terminal ENABLE is not asserted. When the output driver is enabled (ENABLE is set to a logic high), the value of the data signal received at input terminal DATAOUT is driven on the bus conductor connected to output terminal IOPUT. If input terminal DATAOUT is at a logic high, then IOPUT will be driven by stacked PFET transistors P1 and P2. The gate of transistor P1 will be at zero and the node PGATE at the gate of transistor P2 will be biased at one threshold voltage drop ($V_{TLP}$, the threshold voltage of transistor $L_P$) above ground voltage GND. Node PGATE being biased at $V_{TLP}$ prevents transistor P2 from being exposed to a gate voltage $V_{gs}$ which exceeds the maximum $V_{gs}$ allowed by the technology employed to implement the off-chip driver. When reflections from the bus (overshoots in this case) reach node IOPUT, diode D1 will shunt any voltage exceeding one threshold voltage above the power supply voltage $V_{DD}$.

Similarly, if input terminal DATAOUT is at a logic zero, node PGATE will be biased at a voltage level of one threshold voltage drop ($V_{TLN}$, the threshold voltage of transistor $L_N$) below power supply voltage $V_{DD}$. Node PGATE being biased at a level below power supply voltage $V_{DD}$ will prevent transistor P2 from being exposed to a gate voltage exceeding the maximum allowable gate voltage. When reflections from the bus (undershoots, in this case) reach output terminal IOPUT, diode D2 will shunt any voltage exceeding one threshold voltage below ground voltage GND.

The output driver circuit depicted in FIG. 2 is replicated for each off-chip output driver within a packaged integrated circuit device, which will generally include at least one instance of the circuit for each bus conductor or group of bus conductors which are independently driven by the packaged integrated circuit. Moreover, those skilled in the art will recognize that a similar output stage having stacked devices and a latch bias generator may be implemented for a negative power supply voltage in devices which employ differential signalling.

The present invention provides overvoltage protection even for the threshold voltage required to activate other overvoltage protection devices. Extremely tight tolerances for gate voltages are thus achieved, allowing the thinnest possible gate oxides to be employed as device dimensions are driven to smaller levels. Since the off-chip driver circuit must be replicated for numerous bus conductors, the smaller device geometries which may be employed may save considerable area. Higher frequency operation is also possible with thinner gate oxides and smaller devices.

While the invention has been particularly shown and described with reference to a preferred embodiment, it will be understood by those skilled in the art that various changes in form and detail may be made therein without departing from the spirit and scope of the invention.

What is claimed is:

1. An off-chip driver output stage comprising:
   first and second devices connected in series between a power supply voltage and an output; and
   a biasing device biasing a gate of the second device to a voltage level of either one threshold voltage above a ground voltage or one threshold voltage below the power supply voltage,
   wherein the biasing device:
   biases the gate of the second device to the voltage level of one threshold voltage above the ground voltage in response to a logical low signal at a data input; and
   biases the gate of the second device to the voltage level of one threshold voltage below the power supply voltage in response to a logical high signal at the data input.

2. The off-chip driver output stage of claim 1, wherein the biasing device further comprises:
   a first diode-connected transistor connected between the power supply voltage and the gate of the second device; and
   a second diode-connected transistor connected between the gate of the second device and the ground voltage.

3. The off-chip driver output stage of claim 2, wherein the first diode-connected transistor is connected at a gate and a drain to the power supply voltage and the second diode-connected transistor is connected at a source to the gate of the second device, and wherein the biasing device further comprises:
   a third device connected at a drain to a source of the first diode-connected transistor and connected at a source to the gate of the second device;
   a fourth device connected at a drain to a gate and a drain of the second diode-connected transistor, connected at a source to the ground voltage, and connected at a gate to a first input to the biasing device;
   a fifth device connected at a source to the ground voltage, connected at a drain to a gate of the third device, and connected at a gate to a second input of the biasing device, wherein the second input receives a signal complementary to a signal received by the first input of the biasing device;
   a sixth device connected at a drain to the drain of the fifth device and connected at a gate to the gate of the second device; and
   a third diode-connected transistor connected at a drain and a gate to the power supply voltage and connected at a source to a source of a source of the sixth device.

4. The off-chip driver output stage of claim 1, further comprising:
   a first overvoltage protection device connected between the output and the power supply voltage; and
   a second overvoltage protection device connected between the output and the ground voltage.

5. The off-chip driver output stage of claim 4, wherein:
   the first overvoltage protection device comprises a diode connected at an input to the output and connected at an output to the power supply voltage; and
   the second overvoltage protection device comprises a diode connected at an output to the output and connected at an input to the ground voltage.

6. The off-chip driver output stage of claim 1, further comprising:
   first and second n-channel transistors connected in series between the output and the ground voltage;

a diode-connected n-channel transistor connected a gate and a drain to the power supply voltage and at a source to a gate of the second n-channel transistor;

a first logic gate receiving a data signal and a complement of an enable signal and generating an output signal which is a logical NOR of the data signal and the complement of the enable signal, wherein the first logic gate output signal is transmitted to a first input of the biasing device and a complement of the first logic gate output signal is transmitted to a second input of the biasing device; and a second logic gate receiving a complement of the data signal and the enable signal and generating an output signal which is a logical NAND of the complement of the data signal and the enable signal, wherein a complement of the second logic gate output signal is transmitted to a gate of the first n-channel transistor, wherein the output is tristated when the enable signal is at a logical low.

7. The off-chip driver output stage of claim 1, wherein the first and second devices comprise p-channel field effect transistors.

8. The off-chip driver output stage of claim 1, wherein the biasing device comprises a latch.

9. A method of providing overvoltage protection for an off-chip driver output stage, comprising:

connecting first and second devices in series between a power supply voltage and an output; and biasing a gate of the second device to a voltage level of either one threshold voltage above a ground voltage or one threshold voltage below the power supply voltage by biasing the gate of the second device to the voltage level of one threshold voltage above the ground voltage in response to a logical low signal at a data input, and biasing the gate of the second device to the voltage level of one threshold voltage below the power supply voltage in response to a logical high signal at the data input.

10. The method of claim 9, wherein the step of biasing a gate of the second device to a voltage level of either one threshold voltage above a ground voltage or one threshold voltage below the power supply voltage further comprises:

connecting a first diode-connected transistor between the power supply voltage and the gate of the second device; and connecting a second diode-connected transistor between the gate of the second device and the ground voltage.

11. The method of claim 9, further comprising:

connecting a first diode at an input to the output and at an output to the power supply voltage; and connecting a second diode at an input to the ground voltage and at an output to the output.

12. The method of claim 9, wherein the step of connecting first and second devices in series between a power supply voltage and an output further comprises:

connecting a first p-channel transistor to the power supply voltage; and connecting a second p-channel transistor to the first p-channel transistor and the output.

13. A processor, comprising:

a bus interface unit, the bus interface unit including a plurality of off-chip drivers for connection to a corresponding plurality of bus conductors, each off-chip driver within the plurality of off-chip drivers including an output stage comprising:

first and second devices connected in series between a power supply voltage and an output; and a biasing device biasing a gate of the second device to a voltage level of either one threshold voltage above a ground voltage or one threshold voltage below the power supply voltage, wherein the biasing device biases the gate of the second device to the voltage level of one threshold voltage above the ground voltage in response to a logical low signal at a data input for the output stage, and biases the gate of the second device to the voltage level of one threshold voltage below the power supply voltage in response to a logical high signal at the data input.

14. The processor of claim 13, wherein the biasing device further comprises:

a first diode-connected transistor connected between the power supply voltage and the gate of the second device; and a second diode-connected transistor connected between the gate of the second device and the ground voltage.

15. The processor of claim 14, wherein the first diode-connected transistor is connected at a gate and a drain to the power supply voltage and the second diode-connected transistor is connected at a source to the gate of the second device, and wherein the biasing device further comprises:

a third device connected at a drain to a source of the first diode-connected transistor and connected at a source to the gate of the second device;

a fourth device connected at a drain to a gate and a drain of the second diode-connected transistor, connected at a source to the ground voltage, and connected at a gate to a first input to the biasing device;

a fifth device connected at a source to the ground voltage, connected at a drain to a gate of the third device, and connected at a gate to a second input of the biasing device, wherein the second input receives a signal complementary to a signal received by the first input of the biasing device;

a sixth device connected at a drain to the drain of the fifth device and connected at a gate to the gate of the second device; and a third diode-connected transistor connected at a drain and a gate to the power supply voltage and connected at a source to a source of a source of the sixth device.

16. The processor of claim 13, wherein the output stage further comprises:

a first diode connected at an input to the output and at an output to the power supply voltage; and a second diode connected at an input to the ground voltage and at an output to the output.

17. The processor of claim 13, wherein the first and second devices comprise p-channel field effect transistors connected in series between the power supply voltage and the output of the output stage.

18. The processor of claim 13, wherein the biasing device comprises a latch.

* * * * *